US012644199B2

(12) United States Patent
Berke et al.

(10) Patent No.: US 12,644,199 B2
(45) Date of Patent: Jun. 2, 2026

(54) SUBSTRATE STICKING AND BREAKAGE MITIGATION

(71) Applicant: Lam Research Corporation, Fremont, CA (US)

(72) Inventors: Aaron Berke, Portland, OR (US); John Floyd Ostrowski, Lake Oswego, OR (US); Santosh Kumar, Beaverton, OR (US); Boon Kang Ong, Beaverton, OR (US); Robert Rash, West Linn, OR (US); Ian Waller, Sherwood, OR (US); Lawrence Kingrey, Oregon City, OR (US); Brett M. Herzig, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1089 days.

(21) Appl. No.: 17/611,885

(22) PCT Filed: May 13, 2020

(86) PCT No.: PCT/US2020/032766
§ 371 (c)(1),
(2) Date: Nov. 16, 2021

(87) PCT Pub. No.: WO2020/236497
PCT Pub. Date: Nov. 26, 2020

(65) Prior Publication Data
US 2022/0220627 A1    Jul. 14, 2022

Related U.S. Application Data

(60) Provisional application No. 62/849,695, filed on May 17, 2019.

(51) Int. Cl.
*C25D 17/06* (2006.01)
*B25J 9/16* (2006.01)
(Continued)

(52) U.S. Cl.
CPC ............ *C25D 17/06* (2013.01); *B25J 9/1633* (2013.01); *B25J 11/0095* (2013.01);
(Continued)

(58) Field of Classification Search
CPC ......... C25D 7/12–7/126; C25D 17/001; C25D 17/06
See application file for complete search history.

(56) References Cited

U.S. PATENT DOCUMENTS 8,900,425 B2 * 12/2014 Harris ................. C25D 17/008
204/297.1
2004/0140217 A1 * 7/2004 Herchen ............. H01L 21/2885
257/E21.175
(Continued)

FOREIGN PATENT DOCUMENTS

CN        1714177        12/2005
CN        101798698       8/2010
(Continued)

OTHER PUBLICATIONS

International Application Serial No. PCT/US2020/032766, International Search Report mailed Aug. 21, 2020, 4 pgs.
(Continued)

*Primary Examiner* — Alexander W Keeling
(74) *Attorney, Agent, or Firm* — Schwegman Lundberg & Woessner, P.A.

(57) ABSTRACT

In one example, the disclosed apparatus is a substrate contact-ring to support a substrate. The substrate contact-ring includes a peripheral structure sized and configured to support the substrate within the substrate contact-ring. The peripheral structure includes a substantially flat ring-section, and a spaced array of contact fingers mechanically coupled to the substantially flat ring-section. Each of the spaced array of contact fingers is resiliently movable to engage an edge of
(Continued)

the substrate supported within the substrate contact-ring. A proximal end of each of the contact fingers is mechanically coupled to the flat ring section of the substrate contact-ring and a distal end of each of the contact fingers is resiliently movable radially inwardly and outwardly of the substrate contact-ring to alternately engage and release the edge of the substrate when the substrate is alternately being supported or removed from the substrate contact-ring. Other apparatuses and methods are disclosed.

13 Claims, 4 Drawing Sheets

(51) Int. Cl.

| | | |
|---|---|---|
| *B25J 11/00* | (2006.01) | |
| *B25J 13/08* | (2006.01) | |
| *C25D 21/12* | (2006.01) | |
| *H10P 72/10* | (2026.01) | |

(52) U.S. Cl.
CPC ............ *B25J 13/085* (2013.01); *C25D 21/12* (2013.01); *H10P 72/18* (2026.01)

(56) References Cited

U.S. PATENT DOCUMENTS

| | | | | |
|---|---|---|---|---|
| 2006/0226000 | A1* | 10/2006 | Hanson ................. | C25D 17/001 |
| | | | | 204/242 |
| 2012/0181170 | A1* | 7/2012 | Prabhakar ............ | C25D 17/001 |
| | | | | 204/297.06 |
| 2015/0174768 | A1 | 6/2015 | Rodnick | |
| 2016/0201212 | A1* | 7/2016 | Ostrowski ............ | C25D 17/005 |
| | | | | 204/297.01 |
| 2017/0275776 | A1* | 9/2017 | Wilson ................. | H01L 21/2885 |
| 2018/0251907 | A1 | 9/2018 | Thorkelsson et al. | |
| 2018/0320285 | A1 | 11/2018 | Wang et al. | |

FOREIGN PATENT DOCUMENTS

| | | | |
|---|---|---|---|
| CN | 114127342 | A | 3/2022 |
| CN | 114127342 | | 8/2024 |
| CN | 119040997 | A | 11/2024 |
| KR | 20100067072 | | 6/2010 |
| KR | 20150073873 | | 7/2015 |
| KR | 20180087379 | | 8/2018 |
| KR | 20180100488 | | 9/2018 |
| KR | 20180119683 | | 11/2018 |
| KR | 102821684 | B1 | 6/2025 |
| TW | I857055 | | 10/2024 |

OTHER PUBLICATIONS

International Application Serial No. PCT/US2020/032766, Written Opinion mailed Aug. 21, 2020, 7 pgs.

"International Application Serial No. PCT US2020 032766, International Preliminary Report on Patentability mailed Dec. 2, 2021", 9 pages.

"Taiwanese Application Serial No. 109116164, Office Action mailed Nov. 28, 2023", w English Translation, 11 pgs.

"Chinese Application Serial No. 202080050458.1, Office Action mailed Jan. 5, 2024", w machine English Translation, 16 pgs.

"Taiwanese Application Serial No. 109116164, Response filed Feb. 23, 24 to Office Action mailed Nov. 28, 2023", W English Claims, 43 pgs.

"Chinese Application Serial No. 202080050458.1, Response filed Apr. 30, 2024 to Office Action mailed Jan. 5, 2024", w English claims, 2 pgs.

"Korean Application Serial No. 10-2021-7041375, Notice of Preliminary Rejection mailed Jul. 15, 2024", w English Translation, 16 pgs.

"Korean Application Serial No. 10-2021-7041375, Response filed Sep. 13, 2024 to Notice of Preliminary Rejection mailed Jul. 15, 2024", w English claims, 22 pgs.

"Chinese Application Serial No. 202410957565.2, Voluntary Amendment Filed Feb. 6, 2025", w English claims, 3 pgs.

\* cited by examiner

SUBSTRATE STICKING AND BREAKAGE MITIGATION

CLAIM OF PRIORITY

This application is a U.S. National Stage Filing under 35 U.S.C. 371 from International Application No. PCT/US2020/032766, filed on May 13, 2020, and published as WO 2020/236497 A1 on Nov. 26, 2020, which claims the priority benefit to U.S. patent application Ser. No. 62/849, 695, filed on 17 May 2019, and entitled "SUBSTRATE STICKING AND BREAKAGE MITIGATION," each of which is incorporated by reference herein in its entirety.

FIELD

The present disclosure generally relates to substrate (e.g., a semiconductor wafer) sticking and breakage mitigation, and more particularly to a substrate contact-ring for reducing substrate sticking (during operations such as electroplating. The disclosed subject matter also relates to a process flow to avoid or at least mitigate substrate breakage.

BACKGROUND

A substrate can stick to a substrate holder when the substrate is processed in a hot plating bath. Picking the substrate up with excessive force, for example, by a robot, can lead to substrate breakage. In some instances, a material such as, for example, an under-baked photo-resist, can form a sticky gel after immersion in a plating bath. This sticky gel can stick to the substrate and hinder a clean removal of the substrate from the substrate holder.

The background description provided here is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the present disclosure. Consequently, the information described in this section is provided to offer the skilled artisan a context for the following disclosed subject matter and should not be considered as admitted prior art.

SUMMARY

An embodiment of the disclosed subject matter describes a substrate contact-ring to support a substrate, the substrate contact-ring including a peripheral structure sized and configured to support the substrate within the substrate contact-ring. The peripheral structure including a substantially flat ring-section, and a spaced array of contact fingers mechanically coupled to the substantially flat ring-section. Each of the spaced array of contact fingers is resiliently movable to engage an edge of the substrate supported within the substrate contact-ring. A proximal end of each of the contact fingers is mechanically coupled to the flat ring section of the substrate contact-ring and a distal end of each of the contact fingers is resiliently movable radially inwardly and outwardly of the substrate contact-ring to alternately engage and release the edge of the substrate when the substrate is alternately supported within the substrate contact-ring and removed from the substrate contact-ring.

An embodiment of the disclosed subject matter describes a method for removing a substrate from a substrate contact-ring. The method includes positioning an end effector of a robot to contact the substrate, moving the end effector and the substrate to a pre-determined z-offset position, measuring a level of torque applied to the end effector, and making a determination as to whether the measured level of torque is greater than a pre-determined target value of torque. Based on a determination that the measured level of torque is greater than a pre-determined target value of torque waiting a pre-determined period-of-time, and re-measuring an additional level of torque applied to the end effector. Based on a determination that the additional re-measured level of torque is greater than a pre-determined target value of torque, displaying an error message. Based on a determination that the measured level of torque is not greater than or is equal to a pre-determined target value of torque, continuing movement of the end effector and the substrate by an additional z-offset distance.

An embodiment of the disclosed subject matter describes a tangible computer-readable medium having no transitory signals and containing instructions that, when executed by one or more hardware-based processors of a machine, cause the machine to perform operations including positioning an end effector of a robot to contact the substrate, moving the end effector and the substrate to a pre-determined z-offset position, measuring a level of torque applied to the end effector, and making a determination as to whether the measured level of torque is greater than a pre-determined target value of torque. Based on a determination that the measured level of torque is greater than a pre-determined target value of torque waiting a pre-determined period-of-time, and re-measuring an additional level of torque applied to the end effector. Based on a determination that the additional re-measured level of torque is greater than a pre-determined target value of torque, displaying an error message. Based on a determination that the measured level of torque is not greater than or is equal to a pre-determined target value of torque, continuing movement of the end effector and the substrate by an additional z-offset distance.

In some exemplary embodiments of the disclosed subject matter, a substrate contact-ring is provided. The substrate contact-ring has an enhanced thickness in some examples, which provides an increased release force configured to overcome removal resistance offered by a sticky substrate when seeking to be released from a substrate holder.

In other aspects, a process flow is provided to mitigate substrate sticking and breakage. In some examples, the process flow is implemented through, for example, firmware.

In some examples, a substrate contact-ring is provided for picking up a sticky substrate from a substrate holder. An example of a substrate contact-ring may comprise a peripheral structure sized and configured to support a substrate within the substrate contact-ring in an electroplating bath; the peripheral structure including a flat ring section and an array of resilient contact fingers to engage an edge of a substrate supported within the substrate contact-ring. A proximal end of each contact finger is connected to the flat ring section of the substrate contact-ring, and a distal end of each contact finger is resiliently movable radially inwardly and outwardly of the substrate contact-ring to engage or release the edge of the substrate when the substrate is supported within the substrate contact-ring. The flat ring section and each contact finger has a sectional thickness. In various embodiments, the sectional thickness is in a range of about 0.10 mm to about 0.18 mm (approximately 0.004 inches to approximately 0.007 inches), the sectional thickness imbuing the array of contact fingers with a substrate release-force that is sufficient to overcome adhesion between the substrate and a lip-seal when the substrate is removed from the substrate holder.

In some examples, a sectional thickness of the substrate contact-ring is about 0.13 mm (approximately 0.005 inch).

In some examples, the substrate release-force is sufficient to overcome adhesion between the substrate and the lip-seal free of a slip agent on the lip-seal.

In some examples, the contact fingers are integrally formed with the substantially flat ring-section and have approximately a same sectional thickness as the substantially flat ring-section.

In some examples, the contact fingers are integrally formed with the substantially flat ring-section and have a different sectional thickness than the substantially flat ring-section.

In some examples, the array of contact fingers is a spaced array of contact fingers. In various embodiments, one or more segments of the ring section carry no contact fingers.

In some examples, a distal end of each contact finger is bent to define a support surface for the substrate supported within the substrate contact-ring. A length of the support surface is in the range of about 0.25 mm to about 15 mm (approximately 0.01 inches to approximately 0.6 inches).

DESCRIPTION OF THE DRAWINGS

Some embodiments are illustrated by way of example and not limitation in the views of the accompanying drawings.

DESCRIPTION

Figures 1A, 1B, 1C:
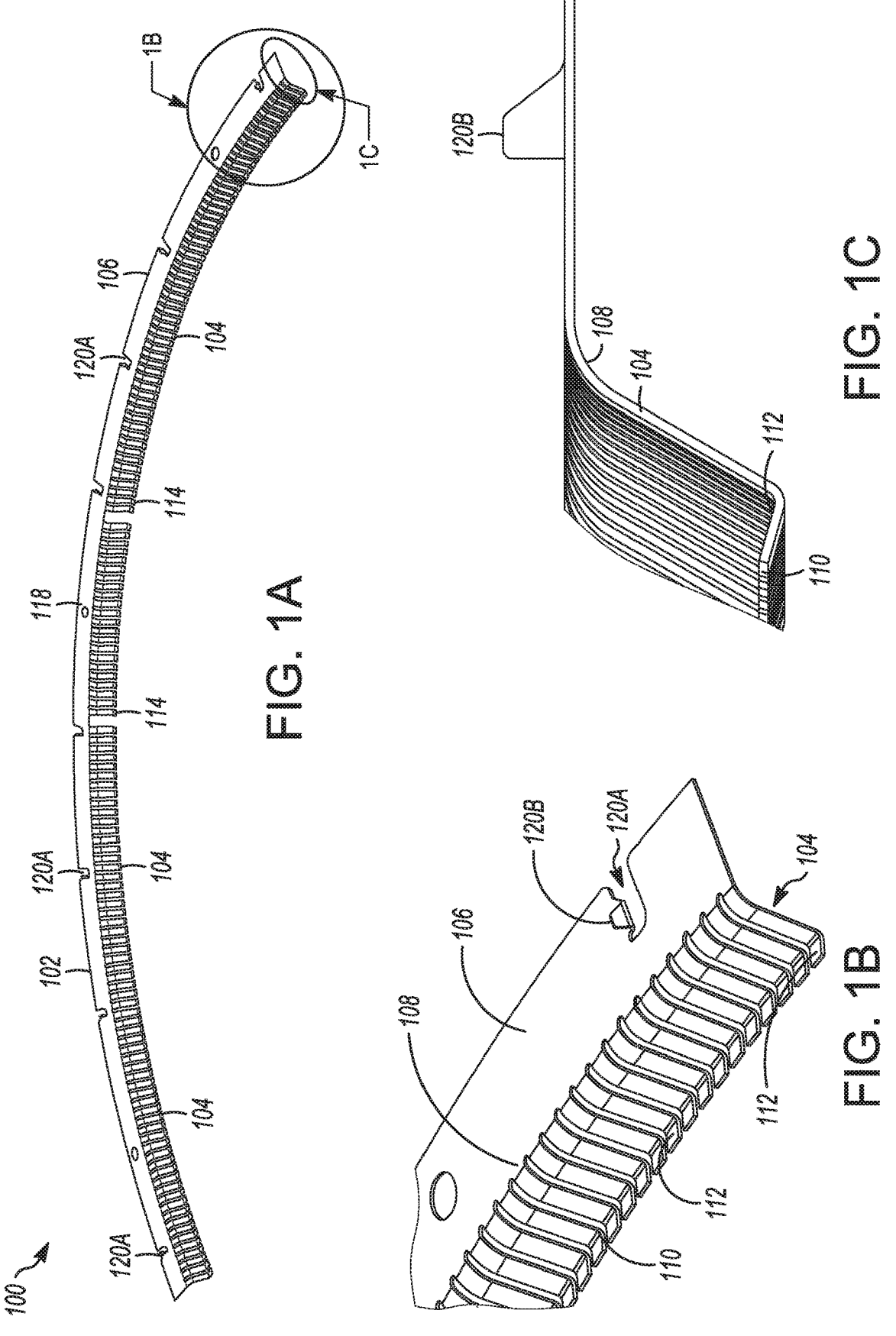
FIGS. 1A through 1E are pictorial views of a substrate contact-ring (including sectional and expanded views), according to various exemplary embodiments of the disclosed subject matter.

The description that follows includes systems, devices, methods, techniques, instruction sequences, and computing machine program products that embody illustrative embodiments of the disclosed subject matter. In the following description, for purposes of explanation, numerous specific details are set forth in order to provide a thorough understanding of various exemplary embodiments. It will be evident to one skilled in the art, however, upon reading and understanding the disclosed subject matter, that the disclosed subject matter may be practiced without these specific details.

A portion of the disclosure of this document contains material that may be subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and as shown in the drawings that form a part of this document: Copyright Lam Research Corporation, 2019, All Rights Reserved.

As described above, in certain types of substrate electroplating applications (e.g., a high-temperature bath), a photo-resist (PR) residue can build up on the lip-seal of a plating cell and lead to the substrate sticking to the lip-seal of the cell. Typically, an end effector of a robot picks up the substrate. However, in conventional techniques, a vacuum within the end effector of the robot, while picking up the substrate, can exert excessive torque on the substrate. The torque, in turn, may cause the substrate to break. Prior efforts to include a slip agent, such as a polytetrafluoroethylene (PTFE)-based coating on the lip seal, may reduce adhesion. However, the PTFE coating wears off after a period-of-time. The problem of excessive torque and a resulting substrate breakage can then present itself again.

FIG. 1A shows a pictorial view of an arcuate (or part circular) section of a substrate contact-ring 100. A portion of the substrate contact-ring 100 is shown in enlarged detail in FIG. 1C. A portion of the substrate contact-ring 100 is shown in part-sectional detail in FIG. 1C. Referring again to FIG. 1A, in some examples, the substrate contact-ring 100 includes four such part-circular sections to make up a complete ring. The substrate contact-ring 100 has a peripheral structure 102 configured to grip the edge of a substrate (not shown) in, for example, an electroplating bath (not shown).

With continuing reference to FIG. 1A, and as shown more clearly in the enlarged detail in FIG. 1B and FIG. 1C, the peripheral portion 102 of the substrate contact-ring 100 includes a series of electrical contact fingers 104. The contact fingers 104 are flexible and resilient so that they can deform inwardly or outwardly to accommodate and grip the edge of the substrate when the substrate is placed into the substrate contact-ring 100. The contact fingers 104 are carried by a substantially flat (e.g., planar) ring-section 106 of the substrate contact-ring 100.

A proximal end or root 108 of each of the contact fingers 104 is attached (or otherwise integrally formed) with the flat ring-section 106, for example, as shown. A distal or free end 110 of each contact finger 104 is bent as shown to provide a support surface 112 (or landing zone) for a substrate. The contact fingers 104 may be arranged in spaced arrays such that one or more peripheral segments 114 of the ring section 106 carry no contact fingers. Other configurations of the contact fingers 104 are possible. The substrate contact-ring 100 may include one or more mounting apertures 118 (or holes) and alignment slots 120A, or formations, as shown. Additionally, there may be a tab 120B formed adjacent to each of the alignment slots 120A.

Figure 1D:
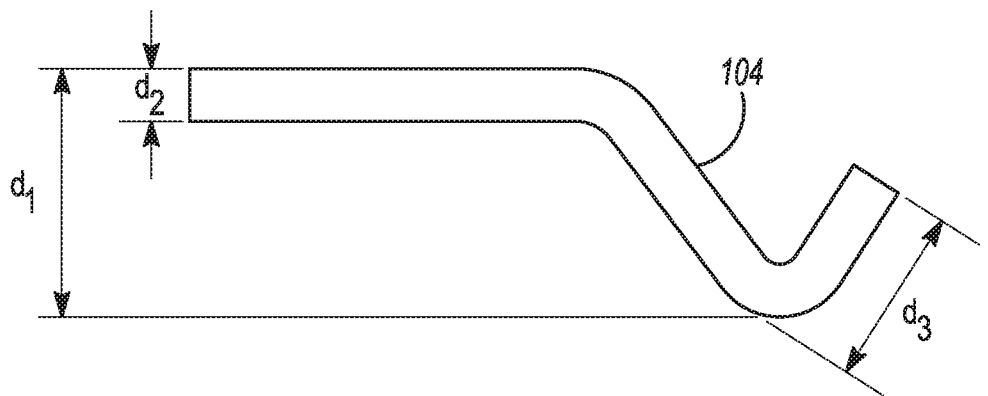

With reference to the elevational view in FIG. 1D, in specific exemplary embodiments, the flat ring-section 106 (see FIG. 1B) of the substrate contact-ring 100 has a sectional thickness, $d_2$, of about 0.13 mm (approximately 0.005 inches). An overall height, $d_1$, of the substrate contact-ring 100 is in a range of about 2.5 mm to about 2.8 mm (approximately 0.10 inches to approximately 0.11 inches). In some examples, a length, $d_3$, of the support surface 112 is in a range of about 0.4 mm to about 1.7 mm (approximately 0.016 inches to approximately 0.067 inches).

In some examples, the contact fingers 104 have the same or similar sectional thickness as the flat ring-section 106. The sectional thickness, $d_2$, is greater than conventionally provided and is selected to imbue the substrate contact-ring 100 with an enhanced stiffness and provide the contact fingers 104 greater resilience and stiffness. Accordingly, the stiffer contact fingers 104 can store more "spring" or deformation energy. The contact fingers 104 can thereby provide an enhanced release force to overcome possible resistance offered by a sticky substrate when it is moved or released from a substrate holder. In some examples, the sectional thickness, $d_2$, of the flat ring-section 106 and the contact fingers 104 is in a range of about 0.10 mm to about 0.18 mm (approximately 0.004 inches to approximately 0.007 inches. In some examples, the sectional thickness, $d_2$, is increased in the range of about 15% to about 30% over conventional sectional-thicknesses. However, upon reading and understanding the disclosed subject matter, a person of ordinary skill in the art will recognize that the above-listed dimensions can vary depending on factors such as a material from which the substrate contact-ring 100 is formed, and physical dimensions of a cup assembly near or into which the substrate contact-ring 100 is placed.

Figure 1E:
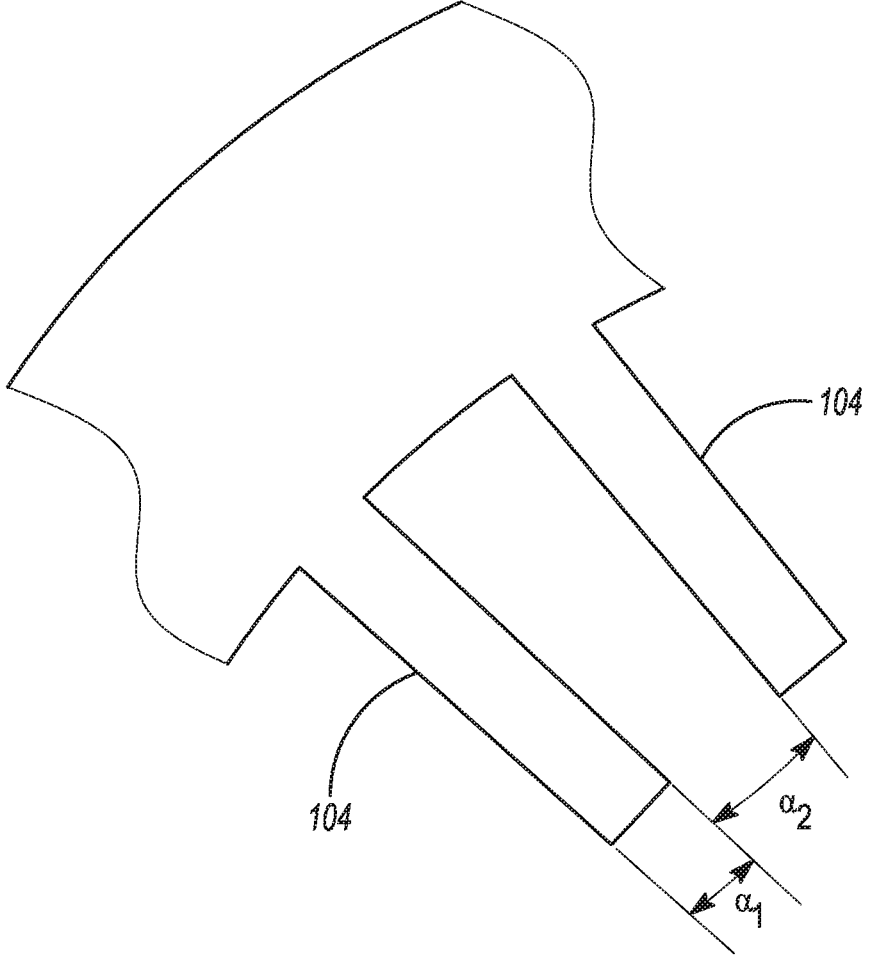

With reference now to FIG. 1E, in a specific exemplary embodiment, a "width" of the contact fingers 104 is defined in degrees since the contact fingers 104 are generally formed as a portion of a circle. For example, there are two typical widths of the contact fingers 104, one related to a substrate having a nominal diameter of 200 mm and the other related to a substrate having a nominal diameter of 300 mm. For 200 mm substrates, a width of the contact fingers 104 is described as an angle, $\alpha_1$, of about 0.6 degrees. For 300 mm substrates, a width of the contact fingers 104 is described as an angle, $\alpha_1$, of about 0.4 degrees. A "distance" between each adjacent one of the contact fingers 104 is also defined in degrees. For example, for 200 mm substrates, a distance between each adjacent one of the contact fingers 104 is described as an angle, $\alpha_2$, of about 0.3 degrees. For 300 mm substrates, a distance" between each adjacent one of the contact fingers 104 is described as an angle, $\alpha_2$, of about 0.2 degrees.

In various embodiments, an overall planarity of the substrate contact-ring 100 is no necessarily related directly to problems of the substrate sticking to the substrate contact-ring 100. Rather, the overall planarity of the substrate contact-ring 100 is generally considered such that an interface between the substrate contact-ring 100 and a substrate is sufficiently flat such that liquids will have little or no leakage between the substrate contact-ring 100 and the substrate sitting thereupon.

In various embodiments, a variety of materials may be used to form portions of or the entirety of the substrate contact-ring 100. Consideration for a choice of material include, for example, chemical compatibility with chemicals encountered by the substrate contact-ring 100, good thermal-conductivity of the bulk material, low contact-resistance, good spring-force, and high reliability for repeated bending. Further, the material can withstand many (e.g., greater than 200,000) compression cycles without breaking. A relatively low cost may also be a consideration as manufacturing methods used to fabricate the substrate contact-ring 100 are relatively low in cost. Upon reading and understanding the disclosed subject matter, a person of ordinary skill in the art will recognize ways in which these various consideration may be quantified for a given operation and use of the substrate contact-ring 100.

In a specific exemplary embodiment, a palladium alloy may be selected as a material from which to fabricate the substrate contact-ring 100. For example, one material that has been found suitable is Paliney® 7 (available from DERINGER-NEY, Inc., 353 Woodland Avenue, Bloomfield, Conn., USA, 06002). Paliney® 7 is a palladium-silver, age-hardenable alloy that contains approximately 10% gold and approximately 10% platinum. The Paliney® 7 alloy may be considered in areas in which long life, stable contact resistance, and low electrical noise, good thermal-conductivity of the bulk material, chemical compatibility with various chemicals described herein, and good spring-force, are critical. Paliney® 7 also includes a high resistance to corrosion and tarnish and provides mechanical properties similar to beryllium copper.

In other exemplary embodiments, depending upon an anticipated use and environment (e.g., contact with certain chemicals) in which the substrate contact-ring 100 will be placed, other electrically-conductive materials may be considered. These materials include, for example, copper and copper alloys (including zinc alloys (e.g., brass), aluminum and various types of aluminum alloys, or various grades of stainless steel (e.g., type 304 or 316L).

In still other exemplary embodiments, and again depending upon an anticipated use and environment (e.g., contact with certain chemicals) in which the substrate contact-ring 100 will be placed, a variety of high-performance alloys (also known as superalloys), known in the art may be considered as a material or materials from which to form the substrate contact-ring 100, from. These high-performance alloys include, for example, Inconel® (available from different sources including Inco Alloys International, Inc., Huntington, W. Va., USA) or Hastelloy® (available from different sources including Haynes Stellite Company, Kokomo, Ind., USA and Union Carbide Corporation, New York, N.Y., USA).

In still other exemplary embodiments, and again depending upon an anticipated use and environment (e.g., contact with certain chemicals) in which the substrate contact-ring 100 will be placed, a variety of polymers or high-performance plastics may be used. In some embodiments, the polymers or high-performance plastics may be impregnated with an electrically-conductive or thermally-conductive material, such as, for example, carbon particles. Such polymers or high-performance plastics include, for example, Delrin® or Kepital®, both of which are known in the art. Both Delrin® are Kepital® are polymers (polyoxymethylene, also known as acetal, polyacetal, and polyformaldehyde) and are also known as engineering thermoplastics. Delrin® is available from DuPont de Nemours, Inc., 200 Powder Mill Road, Wilmington, Del., USA, 19803. Kepital® is available from Korea Engineering Plastics Co., Ltd., 14th Floor, OCI BLDG., 94, Sogong-ro, Jung-gu, Seoul, Republic of Korea, 04532).

In another aspect, an improved process flow is provided to mitigate substrate sticking and breakage. In some examples, a substrate pickup process includes maintaining a torque on the substrate below a target value to avoid substrate breakage. In other words, for a substrate that is "stuck," the process flow includes an operation of making a determination of whether torque applied to the substrate, while attempting to remove the substrate, is excessive. This determination of torque seeks to mitigate the various problems caused by the application of excessive torque as discussed above. In some examples, a torque on a robot end-effector is measured and compared against a target value. If the measured torque exceeds a target value, the substrate is released, or, alternatively, a lower torque is applied, to avoid substrate breakage.

Figure 2:
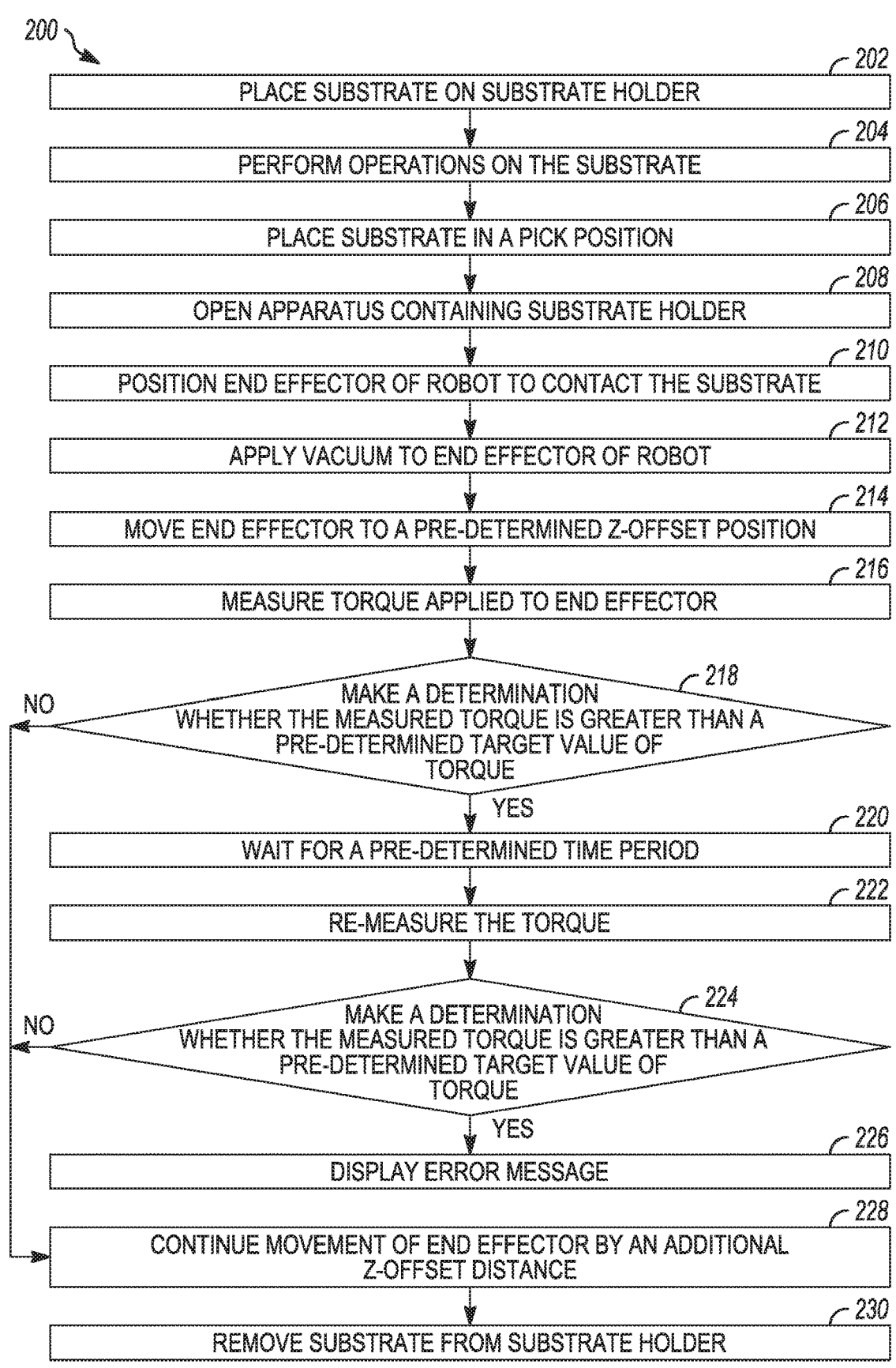
FIG. 2 is a flow chart showing exemplary operations of a method for determining whether a substrate can safely be removed from a substrate holder, according to an exemplary embodiment.

FIG. 2 is a flow chart showing exemplary operations of a method 200 for determining whether a substrate can safely (e.g., without breakage) be removed from a substrate holder, according to an exemplary embodiment. For example, at operation 202, a substrate is placed on a substrate holder. The substrate holder may comprise various embodiments of the substrate contact-ring 100 described above with reference to FIG. 1A through FIG. 1E, described above.

At operation 204, operations are performed on the substrate. The operations may include electroplating on the substrate or other operations known in the art. After the operations are completed, at operation 206, the substrate is placed in a "pick" position such that an end effector of a robot may be positioned to attempt to remove the substrate. The apparatus in which the substrate and substrate holder are located may then be opened at operation 208. The end effector of the robot is positioned to contact the substrate at operation 210 and a vacuum is applied to the end effector at operation 212. The robot then moves the end effector in a pre-determined z-offset position to attempt to lift the substrate from the substrate holder at operation 214. During at least a portion of a period-of-time in which the end effector is attempting to lift the substrate, at operation 216, a quantity of torque applied to the end effector is measured. The torque may be measured by various types of torque-measuring sensors known in the art. These torque-measuring sensors include, for example, reaction-torque cells, rotary torque-sensors, strain gauges mounted to the robotic arm, load cells, and other types of torque-measuring sensors.

At operation 218, a determination is made as to whether the measured torque is greater than a pre-determined target value of torque. The pre-determined target value can be based on a number of considerations such as when the substrate is still within an elastic-deformation region (or range) or a plastic-deformation region (or range) of a stress-strain curve for the substrate. In both the case of the elastic-deformation region and the plastic-deformation region, the pre-determined target value of torque will below a fracture (rupture) value for the substrate. Determining values for the elastic-deformation region and the plastic-deformation region involves calculations known to a person of ordinary skill in the art based on material properties of the substrate. In various embodiments, a determination of the elastic-deformation region and the plastic-deformation regions may be considered for a film or films that are formed on the substrate. Such film elastic/plastic regions for a film may be lower than a calculated value for the substrate upon which such films are formed. In various embodiments, the pre-determined target value of torque may be determined to be within the elastic-deformation region before entering the plastic-deformation region for the substrate and/or a film or films on the substrate.

If the determination as to whether the measured torque is not greater than or is equal to the pre-determined target value of torque at operation 218, movement of the end effector by an additional z-offset distance is continued at operation 228 and the substrate is removed from the substrate holder at operation 230.

If the determination as to whether the measured torque is greater than the pre-determined target value of torque at operation 218, at operation 220, a pre-determined period-of-time is allowed to elapse prior to re-measuring a value of the applied torque at operation 224. During the pre-determined period-of-time, the substrate may tend to loosen or partially overcome any adhesive forces between the substrate and the substrate holder (e.g., the substrate contact-ring 100 of FIG. 1A through FIG. 1E).

At operation 224, another determination is made as to whether the measured torque is greater than a pre-determined target value of torque. If the determination as to whether the measured torque is not greater than the pre-determined target value of torque at operation 224, movement of the end effector by an additional z-offset distance is continued at operation 228 and the substrate is removed from the substrate holder at operation 230. If the determination as to whether the measured torque is greater than the pre-determined target value of torque at operation 224, at operation 226, an error message is displayed at operation 226.

Although the flow chart showing exemplary operations of the method 200 for determining whether a substrate can safely be removed from a substrate holder shows only two determination steps (e.g., at operation 218 and at operation 224) as to whether the measured torque is greater than a pre-determined target value of torque, a person of ordinary skill in the art will recognize than any number of additional determination steps may be added. In another exemplary embodiment, only a single determination step may be employed.

Figure 3:
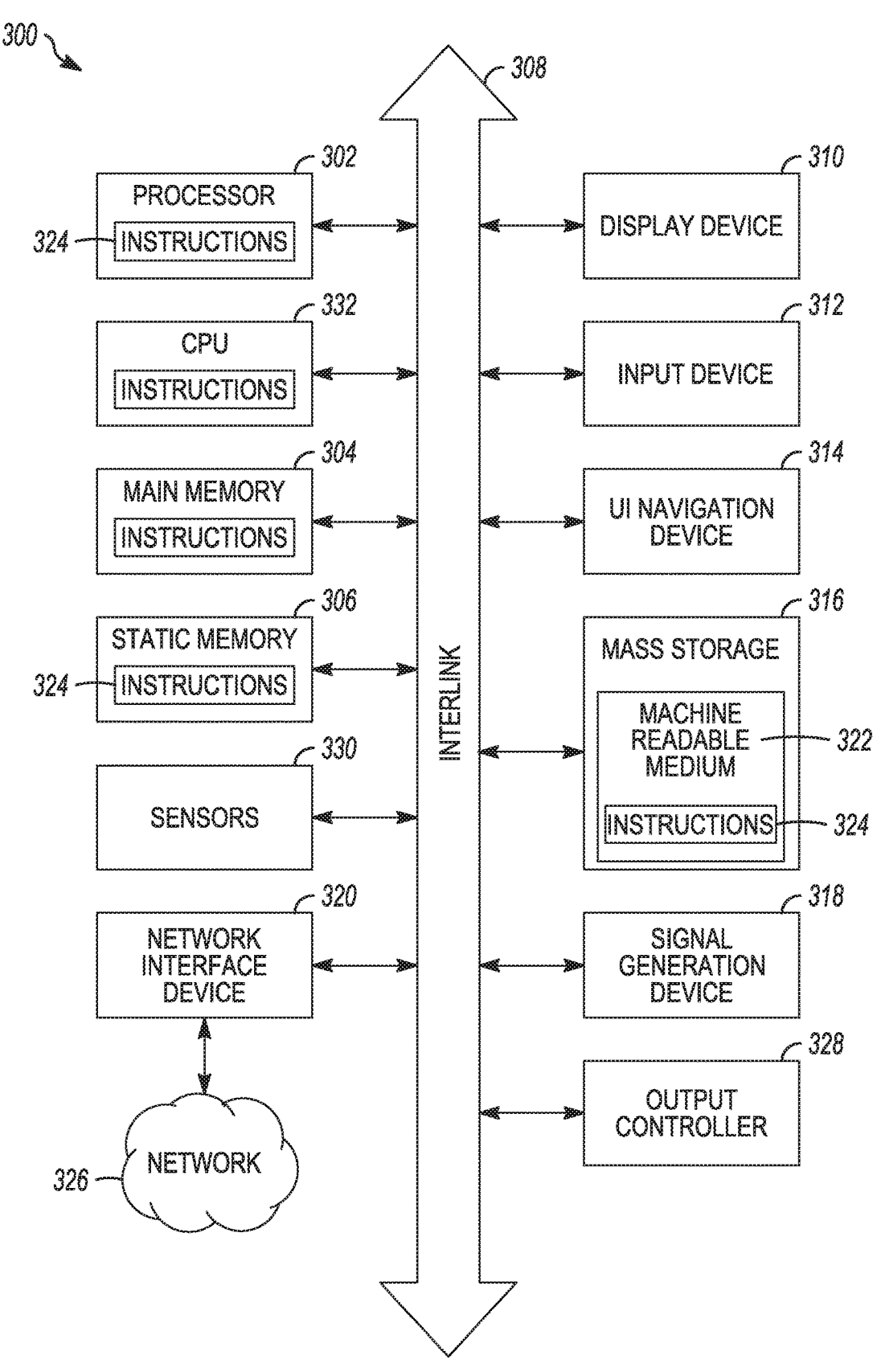
FIG. 3 is a block diagram illustrating an example of a machine upon which one or more exemplary embodiments may be implemented, or by which one or more exemplary embodiments may be controlled.

FIG. 3 is a block diagram illustrating an example of a machine 300 upon which one or more exemplary embodiments of a method described herein may be implemented or controlled, or by which one or more exemplary embodiments of a method described herein may be implemented or controlled. In alternative embodiments, the machine 300 may operate as a standalone device or may be connected (e.g., networked) to other machines. In a networked deployment, the machine 300 may operate in the capacity of a server machine, a client machine, or both, in server-client network environments. In an example, the machine 300 may act as a peer machine in a peer-to-peer (P2P) (or other distributed) network environment. Further, while only a single machine 300 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed-particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine 300 (e.g., computer system) may include a hardware processor 302 (e.g., a central processing unit (CPU), a hardware processor core, or any combination thereof, a graphics processing unit (GPU) 332, a main memory 304, and a static memory 306, some or all of which may communicate with each other via an interlink 308 (e.g., a bus). The machine 300 may further include a display device 310, an alphanumeric input-device 312 (e.g., a keyboard), and a user interface (UI) navigation-device 314 (e.g., a mouse). In various embodiments, the display device 310, the alphanumeric input-device (e.g., bus), and the UI navigation-device (e.g., bus) may comprise a touch-screen display. The machine 300 may additionally include a mass-storage device 316 (e.g., drive unit), a signal-generation device 318 (e.g., a speaker), a network interface-device 320, and one or more sensors 330, such as a Global Positioning System (GPS) sensor, a compass, an accelerometer, or another sensor. The machine 300 may include an output controller 328, such as a serial (e.g., universal serial bus (USB)), parallel, or other wired or wireless (e.g., infrared (IR), near field communication (NFC), etc.) connection to communicate with or control one or more peripheral devices (e.g., a printer, a card reader, etc.).

The mass-storage device 316 may include a machine-readable medium 322 on which is stored one or more sets of data structures or instructions 324 (e.g., software or firmware) embodying or utilized by any one or more of the techniques, functions, or methods described herein. The instructions 324 may also reside, completely or at least partially, within the main memory 304, within the static memory 306, within the hardware processor 302, or within the CPU 332 during execution thereof by the machine 300. In an example, one or any combination of the hardware processor 302, the GPU 332, the main memory 304, the static memory 306, or the mass-storage device 316 may constitute machine-readable media.

While the machine-readable medium 322 is illustrated as a single medium, the term "machine-readable medium" may include a single medium, or multiple media (e.g., a centralized or distributed database, and/or associated caches and servers) configured to store the one or more instructions 324.

The term "machine-readable medium" may include any medium that can store, encode, or carry the instructions 324 for execution by the machine 300 and that cause the machine 300 to perform any one or more of the techniques of the present disclosure, or that can store, encode, or carry data structures used by or associated with such instructions 324. Non-limiting machine-readable medium examples may include solid-state memories, and optical and magnetic media. In an example, a massed machine-readable medium comprises a machine-readable medium 322 with a plurality of particles having invariant (e.g., rest) mass. Accordingly, massed machine-readable media are not transitory propagating-signals. Specific examples of massed machine-readable media may include non-volatile memory, such as semiconductor memory devices (e.g., Electrically Programmable Read-Only Memory (EPROM). Electrically Erasable Programmable Read-Only Memory (EEPROM)) and flash memory devices; magnetic disks, such as internal hard disks and removable disks; magneto-optical disks; and CD-ROM and DVD-ROM disks. Consequently, each of the aforementioned and other types of non-transitory media are physically capable of movement or capable of being moved themselves. Further, the computer-readable medium may be considered to be a tangible computer-readable medium having no transitory signals. The instructions 324 may further be transmitted or received over a communications network 326 using a transmission medium via the network interface device 320.

Although various embodiments have been described with reference to specific exemplary embodiments, it will be evident that various modifications and changes may be made to these embodiments without departing from the broader scope of the disclosed subject matter. Accordingly, the specification and drawings are to be regarded in an illustrative rather than a restrictive sense. The accompanying drawings that form a part hereof, show by way of illustration, and not of limitation, indicate specific embodiments in which the subject matter may be practiced. The embodiments illustrated are described in sufficient detail to enable those skilled in the art to practice the teachings disclosed herein. Upon reading and understanding the disclosed subject matter, a person of ordinary skill in the art will recognize that other embodiments may be utilized and derived therefrom, such that structural and logical substitutions and changes may be made without departing from the scope of this disclosure. The above description, therefore, is not to be taken in a limiting sense, and the scope of various embodiments is defined only by the appended claims, along with the full range of equivalents to which such claims are entitled.

Such embodiments of the disclosed subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same or similar purpose may be substituted for the specific embodiments shown. This disclosure is therefore intended to cover all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

THE FOLLOWING NUMBERED EXAMPLES
ARE SPECIFIC EMBODIMENTS OF THE
DISCLOSED SUBJECT MATTER

Example 1: An embodiment of the disclosed subject matter describes a substrate contact-ring to support a substrate, the substrate contact-ring including a peripheral structure sized and configured to support the substrate within the substrate contact-ring. The peripheral structure including a substantially flat ring-section, and a spaced array of contact fingers mechanically coupled to the substantially flat ring-section. Each of the spaced array of contact fingers is resiliently movable to engage an edge of the substrate supported within the substrate contact-ring. A proximal end of each of the contact fingers is mechanically coupled to the flat ring section of the substrate contact-ring and a distal end of each of the contact fingers is resiliently movable radially inwardly and outwardly of the substrate contact-ring to alternately engage and release the edge of the substrate when the substrate is alternately supported within the substrate contact-ring and removed from the substrate contact-ring.

Example 2: The substrate contact-ring of Example 1, wherein a sectional thickness of each of the contact fingers is in a range of about 0.10 mm to about 0.18 mm.

Example 3: The substrate contact-ring of any one of Example 1 and Example 2, wherein a sectional thickness of the substantially flat ring-section is in a range of about 0.10 mm to about 0.18 mm.

Example 4: The substrate contact-ring of either one of Example 1 and Example 3, wherein a sectional thickness of each of the contact fingers is about 0.13 mm in thickness.

Example 5: The substrate contact-ring of either one of Example 1 and Example 2, wherein a sectional thickness of the substantially flat ring-section is about 0.13 mm in thickness.

Example 6: The substrate contact-ring of any one of the preceding Examples, wherein the contact fingers are integrally formed with the flat ring section and have a same sectional thickness.

Example 7: The substrate contact-ring of any one of the preceding Examples, wherein the contact fingers are integrally formed with the flat ring section and have a different sectional thickness than the flat ring section.

Example 8: The substrate contact-ring of any one of the preceding Examples, wherein the spaced array of contact fingers is arranged within the substrate contact-ring such that one or more segments of the substrate contact-ring have no contact fingers.

Example 9: The substrate contact-ring of any one of the preceding Examples, wherein a distal end of each contact finger is bent to define a support surface for the substrate within the substrate contact-ring, a length of the support surface being in a range of about 0.4 mm to about 1.7 mm.

Example 10: The substrate contact-ring of any one of the preceding Examples, wherein, for a substrate having a nominal diameter of 200 mm, a width of the contact fingers is defined as an angle of about 0.6 degrees.

Example 11: The substrate contact-ring of any one of the preceding Examples, wherein, for a substrate having a nominal diameter of 300 mm, a width of the contact fingers is described as an angle of about 0.4 degrees.

Example 12: The substrate contact-ring of any one of the preceding Examples, wherein, for a substrate having a nominal diameter of 200 mm, a distance between each adjacent one of the contact fingers is defined as an angle of about 0.3 degrees.

Example 13: The substrate contact-ring of any one of the preceding Examples, wherein, for a substrate having a nominal diameter of 300 mm, a distance between each adjacent one of the contact fingers is defined as an angle of about 0.2 degrees.

Example 14: The substrate contact-ring of any one of the preceding Examples, wherein an overall height of the substrate contact-ring is in a range of about 2.5 mm to about 2.8 mm.

Example 15: An embodiment of the disclosed subject matter describes a method for removing a substrate from a substrate contact-ring. The method includes positioning an end effector of a robot to contact the substrate, moving the end effector and the substrate to a pre-determined z-offset position, measuring a level of torque applied to the end effector, and making a determination as to whether the measured level of torque is greater than a pre-determined target value of torque. Based on a determination that the measured level of torque is greater than a pre-determined target value of torque waiting a pre-determined period-of-time, and re-measuring an additional level of torque applied to the end effector. Based on a determination that the additional re-measured level of torque is greater than a pre-determined target value of torque, displaying an error message. Based on a determination that the measured level of torque is not greater than or is equal to a pre-determined target value of torque, continuing movement of the end effector and the substrate by an additional z-offset distance.

Example 16: The method of Example 15, further including placing the substrate on the substrate contact-ring, the substrate contact-ring having a peripheral structure sized and configured to support the substrate within the substrate contact-ring, the peripheral structure including a substantially flat ring-section and a spaced array of contact fingers mechanically coupled to the substantially flat ring-section, each of the spaced array of contact fingers being resiliently movable to engage an edge of the substrate supported within the substrate contact-ring, a proximal end of each of the contact fingers being mechanically coupled to the flat ring section of the substrate contact-ring, a distal end of each of the contact fingers being resiliently movable radially inwardly and outwardly of the substrate contact-ring to alternately engage and release the edge of the substrate when the substrate is alternately supported within the substrate contact-ring and removed from the substrate contact-ring.

Example 17: The method of either of Examples 15 and 16, further comprising performing operations on the substrate.

Example 18: The method of Example 17, further comprising, subsequent to the performing of operations on the substrate, placing the substrate in a pick position.

Example 19: The method of any one of the preceding Examples 15 et seq., further comprising opening an apparatus in which the substrate contact-ring is located.

Example 20: An embodiment of the disclosed subject matter describes a tangible computer-readable medium having no transitory signals and containing instructions that, when executed by one or more hardware-based processors of a machine, cause the machine to perform operations including positioning an end effector of a robot to contact the substrate, moving the end effector and the substrate to a pre-determined z-offset position, measuring a level of torque applied to the end effector, and making a determination as to whether the measured level of torque is greater than a pre-determined target value of torque. Based on a determination that the measured level of torque is greater than a pre-determined target value of torque waiting a pre-determined period-of-time, and re-measuring an additional level of torque applied to the end effector. Based on a determination that the additional re-measured level of torque is greater than a pre-determined target value of torque, displaying an error message. Based on a determination that the measured level of torque is not greater than or is equal to a pre-determined target value of torque, continuing movement of the end effector and the substrate by an additional z-offset distance.

Example 21: The tangible computer-readable medium of Example 20, further including placing the substrate on the substrate contact-ring, the substrate contact-ring having a peripheral structure sized and configured to support the substrate within the substrate contact-ring, the peripheral structure including a substantially flat ring-section and a spaced array of contact fingers mechanically coupled to the substantially flat ring-section, each of the spaced array of contact fingers being resiliently movable to engage an edge of the substrate supported within the substrate contact-ring, a proximal end of each of the contact fingers being mechanically coupled to the flat ring section of the substrate contact-ring, a distal end of each of the contact fingers being resiliently movable radially inwardly and outwardly of the substrate contact-ring to alternately engage and release the edge of the substrate when the substrate is alternately supported within the substrate contact-ring and removed from the substrate contact-ring.

What is claimed is:

1. A substrate contact-ring to support a substrate, the substrate contact-ring comprising:

a peripheral structure sized and configured to support the substrate within the substrate contact-ring, the peripheral structure comprising:

a substantially flat ring-section; and a spaced array of contact fingers mechanically coupled to the substantially flat ring-section, each of the spaced array of contact fingers being resiliently movable to engage an edge of the substrate supported within the substrate contact-ring, a proximal end of each of the contact fingers being mechanically coupled to the substantially flat ring-section of the substrate contact-ring, a distal end of each of the contact fingers being resiliently movable radially inwardly and outwardly of the substrate contact-ring to alternatively engage and release the edge of the substrate when the substrate is alternatively supported within the substrate contact-ring and removed from the substrate contact-ring, the distal end of each contact finger further being bent to define a support surface for the substrate within the substrate contact-ring, wherein the distal end of each of the contact fingers is integral with a corresponding one of the contact fingers;

a length of each of the support surfaces being substantially the same length and in a range of greater than about 1.0 mm to about 1.7 mm.

2. The substrate contact-ring of claim 1, wherein a sectional thickness of each of the contact fingers is in a range of about 0.10 mm to about 0.18 mm.

3. The substrate contact-ring of claim 1, wherein a sectional thickness of the substantially flat ring-section is in a range of about 0.10 mm to about 0.18 mm.

4. The substrate contact-ring of claim 1, wherein a sectional thickness of each of the contact fingers is about 0.13 mm in thickness.

5. The substrate contact-ring of claim 1, wherein a sectional thickness of the substantially flat ring-section is about 0.13 mm in thickness.

6. The substrate contact-ring of claim 1, wherein the contact fingers are formed with the substantially flat ring-section and have a same sectional thickness.

7. The substrate contact-ring of claim 1, wherein the contact fingers are formed with the substantially flat ring-section and have a different sectional thickness than the substantially flat ring-section.

8. The substrate contact-ring of claim 1, wherein the spaced array of contact fingers is arranged within the substrate contact-ring such that at least one continuous arc segment of the substrate contact-ring has no contact fingers.

9. The substrate contact-ring of claim 1, wherein, for a substrate having a nominal diameter of 200 mm, a width of the contact fingers is defined as an angle of about 0.6 degrees as measured at a radius corresponding to the nominal diameter of the substrate.

10. The substrate contact-ring of claim 1, wherein, for a substrate having a nominal diameter of 300 mm, a width of the contact fingers is described as an angle of about 0.4 degrees as measured at a radius corresponding to the nominal diameter of the substrate.

11. The substrate contact-ring of claim 1, wherein, for a substrate having a nominal diameter of 200 mm, a distance between each adjacent one of the contact fingers is defined as an angle of about 0.3 degrees as measured at a radius corresponding to the nominal diameter of the substrate.

12. The substrate contact-ring of claim 1, wherein, for a substrate having a nominal diameter of 300 mm, a distance between each adjacent one of the contact fingers is defined as an angle of about 0.2 degrees as measured at a radius corresponding to the nominal diameter of the substrate.

13. The substrate contact-ring of claim 1, wherein an overall height of the substrate contact-ring is in a range of about 2.5 mm to about 2.8 mm, the overall height in combination with a sectional thickness of the substantially flat ring-section and the contact fingers providing a release-force sufficient to overcome adhesion between a processed substrate and a lip-seal without application of a slip agent.

* * * * *